US008450161B2

(12) United States Patent
Chen et al.

(10) Patent No.: US 8,450,161 B2
(45) Date of Patent: May 28, 2013

(54) METHOD OF FABRICATING A SEALING STRUCTURE FOR HIGH-K METAL GATE

(75) Inventors: Chien-Hao Chen, Chungwei Township, Ilan County (TW); Hao-Ming Lien, Hsinchu (TW); Ssu-Yu Li, Hsinchu (TW); Jun-Lin Yeh, Hsinchu (TW); Kang-Cheng Lin, Yonghe (TW); Kuo-Tai Huang, Hsinchu (TW); Chii-Horng Li, Jhu-Bei (TW); Chien-Liang Chen, Hsinchu (TW); Chung-Hau Fei, Hsinchu (TW); Wen-Chih Yang, Changhua (TW); Jin-Aun Ng, Hsinchu (TW); Chi Hsin Chang, Banciao (TW); Chun Ming Lin, Hsinchu (TW); Harry Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/465,551

(22) Filed: May 7, 2012

(65) Prior Publication Data
US 2012/0225529 A1    Sep. 6, 2012

Related U.S. Application Data

(62) Division of application No. 12/389,535, filed on Feb. 20, 2009, now Pat. No. 8,193,586.

(60) Provisional application No. 61/091,629, filed on Aug. 25, 2008.

(51) Int. Cl.
*H01L 21/00* (2006.01)
*H01L 21/02* (2006.01)

(52) U.S. Cl.
USPC .... 438/163; 257/344; 257/408; 257/E29.126; 257/E29.278; 257/E21.409

(58) Field of Classification Search
None
See application file for complete search history.

(56) References Cited

U.S. PATENT DOCUMENTS

| 5,904,528 A | 5/1999 | Lin et al. |
| 6,271,564 B1 | 8/2001 | Morihara et al. |

(Continued)

FOREIGN PATENT DOCUMENTS

| CN | 1308772 | 8/2001 |
| CN | 101087003 | 12/2007 |

OTHER PUBLICATIONS

Taiwanese Patent Office, Office Action dated Oct. 18, 2012, Application No. 10121112450, 6 pages.

(Continued)

*Primary Examiner* — Alonzo Chambliss
(74) *Attorney, Agent, or Firm* — Haynes and Boone, LLP

(57) ABSTRACT

The present disclosure provides a semiconductor device that includes a semiconductor substrate and a transistor formed in the substrate. The transistor includes a gate stack having a high-k dielectric and metal gate, a sealing layer formed on sidewalls of the gate stack, the sealing layer having an inner edge and an outer edge, the inner edge interfacing with the sidewall of the gate stack, a spacer formed on the outer edge of the sealing layer, and a source/drain region formed on each side of the gate stack, the source/drain region including a lightly doped source/drain (LDD) region that is aligned with the outer edge of the sealing layer.

20 Claims, 9 Drawing Sheets

U.S. PATENT DOCUMENTS

| | | |
|---|---|---|
| 6,451,704 B1 | 9/2002 | Pradeep et al. |
| 7,045,431 B2 | 5/2006 | Rotondaro et al. |
| 7,057,237 B2 | 6/2006 | Wang et al. |
| 7,067,434 B2 | 6/2006 | Colombo et al. |
| 7,163,877 B2 | 1/2007 | Niimi et al. |
| 7,205,186 B2 | 4/2007 | Wang et al. |
| 7,226,831 B1 | 6/2007 | Metz et al. |
| 7,768,079 B2 | 8/2010 | Sandford et al. |
| 8,193,586 B2 * | 6/2012 | Chen et al. .................... 257/344 |
| 2004/0033678 A1 | 2/2004 | Arghavani et al. |
| 2007/0262399 A1 | 11/2007 | Dewey et al. |
| 2010/0044803 A1 | 2/2010 | Chen et al. |

OTHER PUBLICATIONS

Chinese Patent Office, Office Action mailed Oct. 8, 2010, Application No. 200910167454.7, 6 pages.

* cited by examiner

Si-rich SiN on surface to block oxygen diffusion

More Oxide at interface for interface trap reduction, more N on surface to block oxygen diffusion Containing metal species for oxygen gettering:
Ti, Ta, Hf, Zr, W, Mo, or combinations thereof

METHOD OF FABRICATING A SEALING STRUCTURE FOR HIGH-K METAL GATE

PRIORITY DATA

This application is a divisional of U.S. patent application Ser. No. 12/389,535 filed on Feb. 20, 2009, now U.S. Pat. No. 8,193,586 issued Jun. 5, 2012, which claims priority to Provisional Application Ser. No. 61/091,629, filed on Aug. 25, 2008, entitled "SEALING STRUCTURE FOR HIGH-K METAL GATE AND METHOD OF MAKING," each of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when integrating a high-k/metal gate feature in a CMOS process flow. For example, during gate patterning or gate etching, edges of the high-k and metal layers may be damaged. Further, during subsequent thermal processing, the high-k and metal materials may be contaminated, and thus performance characteristics such as carrier mobility, threshold voltage, and reliability may degrade.

Accordingly, what is needed is a new and improved method and device that address the above issues.

SUMMARY

One of the broader forms of an embodiment of the invention involves a semiconductor device. The semiconductor device includes a semiconductor substrate, and a transistor formed in the substrate, the transistor including: a gate stack having a high-k dielectric and metal gate; a sealing layer formed on sidewalls of the gate stack, the sealing layer having an inner edge and an outer edge, the inner edge interfacing with the sidewall of the gate stack; a spacer formed on the outer edge of the sealing layer; and a source/drain region disposed at each side of the gate stack, the source/drain region including a lightly doped source/drain (LDD) region that is aligned with the outer edge of the sealing layer.

Another one of the broader forms of an embodiment of the invention involves a semiconductor device. The semiconductor device includes a semiconductor substrate and a transistor formed in the substrate, the transistor including: a gate stack having an interfacial layer, high-k dielectric layer, metal layer, and polysilicon layer, a sealing layer formed on each sidewall of the gate stack, the sealing layer having an inner edge and an outer edge, the inner edge interfacing with the sidewall of gate stack, a spacer formed on the outer edge of the sealing layer, and source/drain regions disposed at either side of the gate stack, each source/drain region including a lightly doped region that is aligned with the outer edge of the sealing layer, where the sealing layer has a first composition proximate the inner edge and a second composition proximate the outer edge, the first composition being different from the second composition.

Yet another one of the broader forms of an embodiment of the invention involves a method for fabricating a semiconductor device. The method includes providing a semiconductor substrate having a high-k dielectric layer and a metal layer formed thereon, patterning the high-k dielectric layer and the metal layer to form a gate structure having sidewalls, performing a first treatment process on the gate structure, forming a sealing layer on the gate structure and on the substrate, performing a second treatment process on the sealing layer, and removing a first portion of the sealing layer such a second portion of the sealing layer remains on the sidewalls of the gate structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
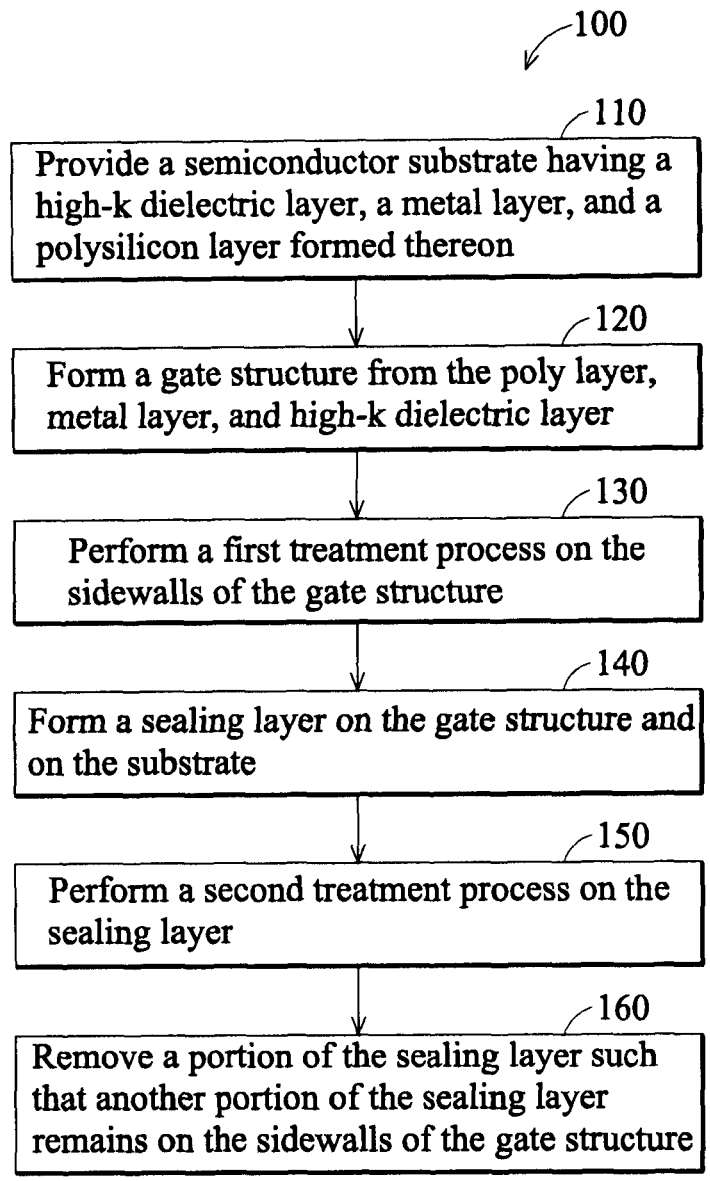
FIG. 1 is a flowchart illustrating a method for fabricating a semiconductor device having a high-k metal gate structure according to various aspects of the present disclosure.

Referring to FIG. 1, illustrated is a flowchart of a method 100 for fabricating a semiconductor device having a high-k metal gate structure according to various aspects of the present disclosure. Referring also to FIGS. 2A to 2E illustrated are cross-sectional views of a semiconductor at various stages of fabrication according to the method 100 of FIG. 1. It is understood that part of the semiconductor device 200 may be fabricated with normal CMOS technology processes, and thus some processes are briefly described herein. Also, FIGS. 2A to 2E are simplified for a better understanding of the inventive concepts of the present disclosure. For example, although the figures illustrate a gate stack for a single device, it is understood the semiconductor device 200 may include a number of various devices including transistors, resistors, capacitors, inductors, fuses, etc. that form an integrated circuit (IC).

The method 100 begins with block 110 in which a semiconductor substrate having a high-k dielectric layer, metal layer, and poly layer formed thereon. The semiconductor device 200 may include a semiconductor substrate 202 such as a silicon substrate. The substrate 202 may alternatively include silicon germanium, gallium arsenic, or other suitable semiconductor materials. The substrate 202 may further include other features such as various doped regions, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 may further include an isolation structure (not shown) such as a shallow trench isolation (STI) feature formed in the substrate 202 for isolating active region in the substrate as is known in the art. The isolation structure may be formed of silicon oxide, silicon nitride, silicon oxynitride, fluoride-doped silicate (FSG), and/or a low k dielectric material known in the art.

The semiconductor device 200 may further include a gate dielectric layer 204 including an interfacial layer/high-k dielectric layer formed over the substrate 202. The interfacial layer may include a silicon oxide layer having a thickness ranging from about 5 to about 10 angstrom (A) formed on the substrate 202. The high-k dielectric layer may be formed on the interfacial layer by atomic layer deposition (ALD) or other suitable technique. The high-k dielectric layer 204 may include a thickness ranging from about 10 to about 40 angstrom (A). The high-k dielectric layer may include hafnium oxide ($HfO_2$). Alternatively, the high-k dielectric layer may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The semiconductor device 200 may further include a capping layer for tuning a work function of a metal layer (for the gate electrode) for properly performing as an N-type metal-oxide-semiconductor (NMOS) transistor device and a P-type MOS (PMOS) transistor device, respectively. For example, the capping layer may include lanthanum oxide, LaSiO, manganese oxide, aluminum oxide, or other suitable materials. The capping layer may be formed on or underneath the high-k dielectric layer.

The semiconductor device 200 may further include a metal gate layer 206 formed over the gate dielectric layer 204. The metal gate layer 206 may include a thickness ranging from about 10 to about 200 angstrom (A). The metal gate layer 206 may be formed by various deposition techniques such as chemical vapor deposition (CVD), physical vapor deposition (PVD or sputtering), plating, or other suitable technique. The metal gate layer 206 may include TiN, TaN, $ZrSi_2$, $MoSi_2$, $TaSi_2$, $NiSi_2$, WN, or other suitable material. The semiconductor device 200 may further include a poly silicon or poly layer 208 formed on the metal gate layer 206 by a deposition or other suitable process.

Figure 2A:
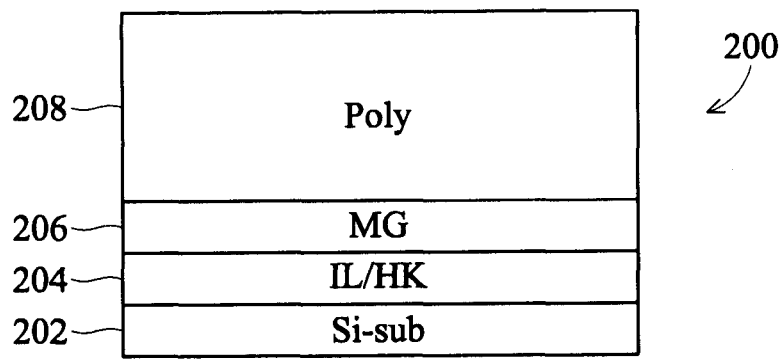
FIGS. 2A to 2E are cross-sectional views of a semiconductor device at various stages of fabrication according to the method of FIG. 1.
Figure 2B:
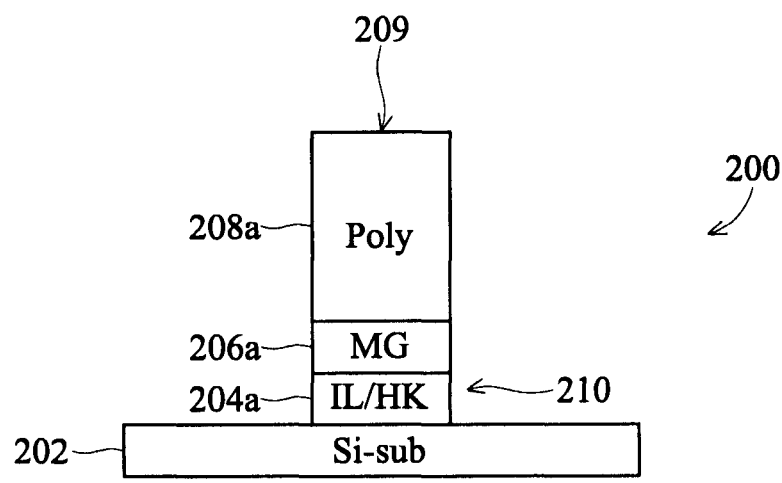

The method 100 continues with block 120 in which the poly layer, metal gate layer, and gate dielectric may be patterned to form a gate structure. In FIG. 2B, the semiconductor device 200 may further include a hard mask (not shown) formed over the poly layer 208. The hard mask may be formed by a deposition process or other suitable process. The hard mask may include silicon nitride, silicon oxynitride, silicon carbide, or other suitable material. A patterned photoresist layer (not shown) may be formed by a photolithography process for gate patterning. The photolithography process may include spin coating, soft-baking, exposure, post-baking, developing, rinsing, drying, and other suitable process. Alternatively, the patterning may be performed by immersion lithography, electron beam lithography, or other suitable process. A first etch process may be performed to pattern the hard mask, and the patterned hard mask may be used to etch (second etch process) the poly layer 208, metal gate layer 206, and the gate dielectric 204 to form a gate stack 209. The second etch process may include a dry or wet etch process. Also, the second etch process may have a high selectivity such that the etch process may stop at the substrate 202. The patterned photoresist layer and hard mask may be removed by stripping or other suitable process. Accordingly, the gate stack 209 may include a poly layer 208a, a metal gate layer 206a, and gate dielectric layer 204a.

Figure 2C:
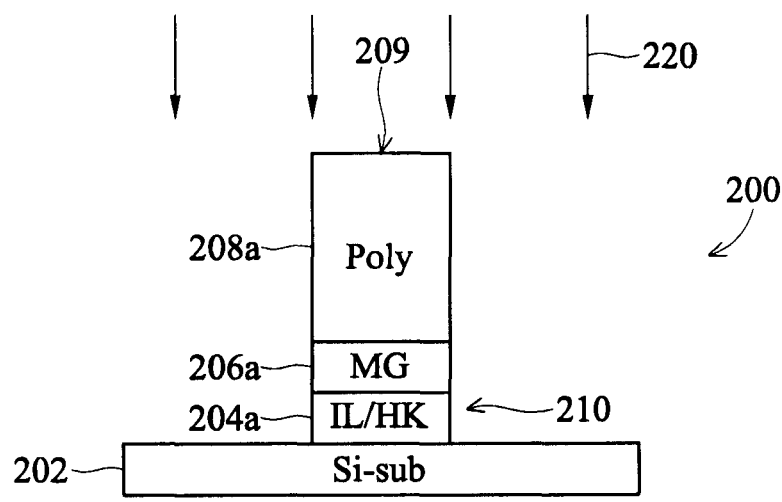

In FIG. 2C, the method 100 continues with block 130 in which a treatment process 220 may optionally be performed on the gate structure. It has been observed that the edges (or sidewalls) 210 of the metal gate layer 206a and high-k gate dielectric 204a of the gate stack 209 may be damaged during the etch process. Accordingly, a performance of the semiconductor device 200 may have serious dimension dependence (e.g., gate length and width) such that different gate lengths and widths may cause variation in the performance characteristics such as threshold voltage. The treatment process 220 may be performed to repair the edges or sidewalls so as to provide an optimal interface (e.g., good adhesion) for a sealing layer as will be discussed below in FIG. 2D.

In some embodiments, the treatment process 220 may include a plasma treatment using gases containing nitrogen or oxygen (e.g., $N_2$, $O_2$, NO, $N_2O$, $NH_3$, etc.). In other embodiments, the treatment process 220 may include an implantation process with nitrogen or oxygen. In some other embodiments, the treatment process 220 may include a low temperature oxide process to form a thin monolayer on the sidewalls, or to treat the surface of the sidewalls to improve the interface. The temperature may be less than 200 degree C. The low temperature oxide process may include atomic layer deposition (ALD), monolayer deposition (MLD), or UV oxide. Additionally, the deposition process may include a plasma enhanced deposition process. In yet other embodiments, the treatment process 220 may include thermal repairing or annealing with gases containing nitrogen or oxygen (e.g., $N_2$, $O_2$, NO, $N_2O$, $NH_3$, etc.). The thermal repairing or annealing may include rapid thermal annealing (RTA), laser spike annealing (LSA), flash-lamp annealing (FLA), and furnace annealing. The thermal repairing may include low temperatures (e.g., less than 200 degree C.) with long heating periods. Alternatively, the thermal repairing may optionally include high temperatures (e.g., greater than 200 degree C.) with short heating periods. It is understood that the various treatment techniques disclosed above may be implemented in various combinations.

Figure 2D:
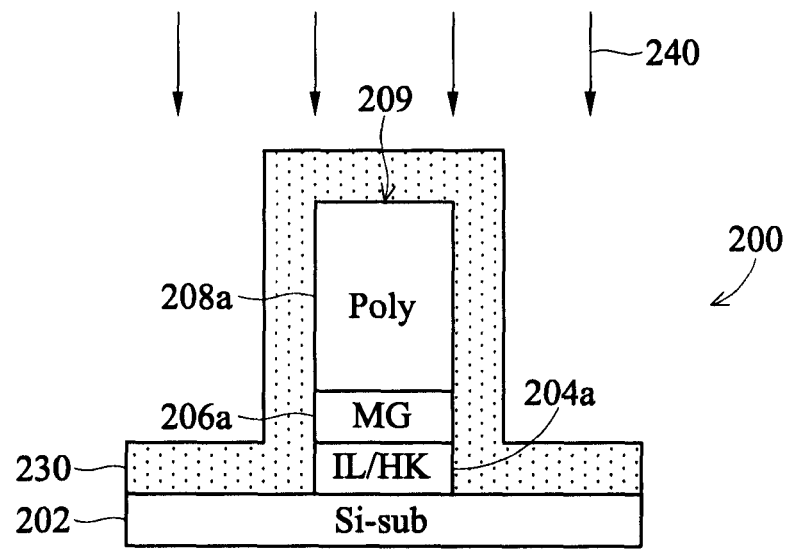

The method 100 continues with block 140 in which a sealing layer may be formed on the sidewalls of the gate stack 209 including the metal gate layer 206a and gate dielectric layer 204a. In FIG. 2D, a sealing layer 240 may be formed over the gate stack 209 and the substrate 202 by CVD or other suitable deposition process. The sealing layer 230 may include a dielectric material such as silicon nitride ($SiN_x$), silicon oxide ($SiO_x$), silicon oxynitride (SiON), silicon carbide (SiC), silicon (Si), silicon germanium (SiGe), or other suitable material. Alternatively, the sealing layer 230 may include an oxygen gettering material such as a metal or alloy or compound or dielectric containing Ti, Ta, Zr, Hf, W, Mo, and combinations thereof.

The method 100 continues with block 150 in which a treatment process may optionally be performed on the sealing layer 240. The treatment process 240 similar to the treatment process 220 of FIG. 2C may be performed after deposition of the sealing layer 230 to improve the interface between the sealing layer 230, and the metal gate layer 206a and high-k gate dielectric 204a. It is understood that the treatment techniques discussed in FIG. 2C may be performed in various combinations.

Figure 2E:
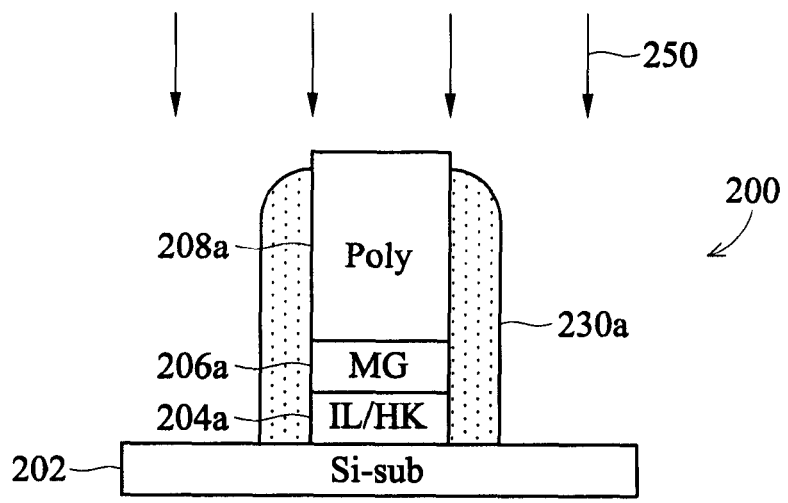

The method 100 continues with block 160 in which a portion of the sealing layer may be removed. In FIG. 2E, an etching process such as a dry etching technique may be performed on the sealing layer 230 such that only a portion of the sealing layer 230a remains on the sidewalls of the high-k gate dielectric 204a, the metal gate layer 206a, and on some or all of the sidewalls of the poly layer 208a. It should be noted that the sealing layer 230a may protect the high-k gate dielectric 204a and metal gate layer 206a from damage during subsequent processing. Accordingly, the integrity of the gate structure 209 may be maintained throughout the semiconductor processing, and thus reliability and device performance may improve. In some embodiments, a treatment process 250 similar to the treatment process 220 of FIG. 2C may be performed after removing a portion of the sealing layer 230 to improve the interface between the sealing layer 230 and, the metal gate layer 206a and high-k gate dielectric 204a. It is understood that the treatment techniques discussed in FIG. 2C may be performed in various combinations.

Thereafter, it is understood that the semiconductor device 200 may undergo normal CMOS process flow to form various features and structures such as lightly doped drain regions (LDD), sidewall spacers, source/drain regions, silicide regions, contacts/vias, metal layers, interlayer dielectric, and so forth. It is understood that the sealing layer 230a discussed above may include various materials and configurations discussed in detail below.

Figure 3:
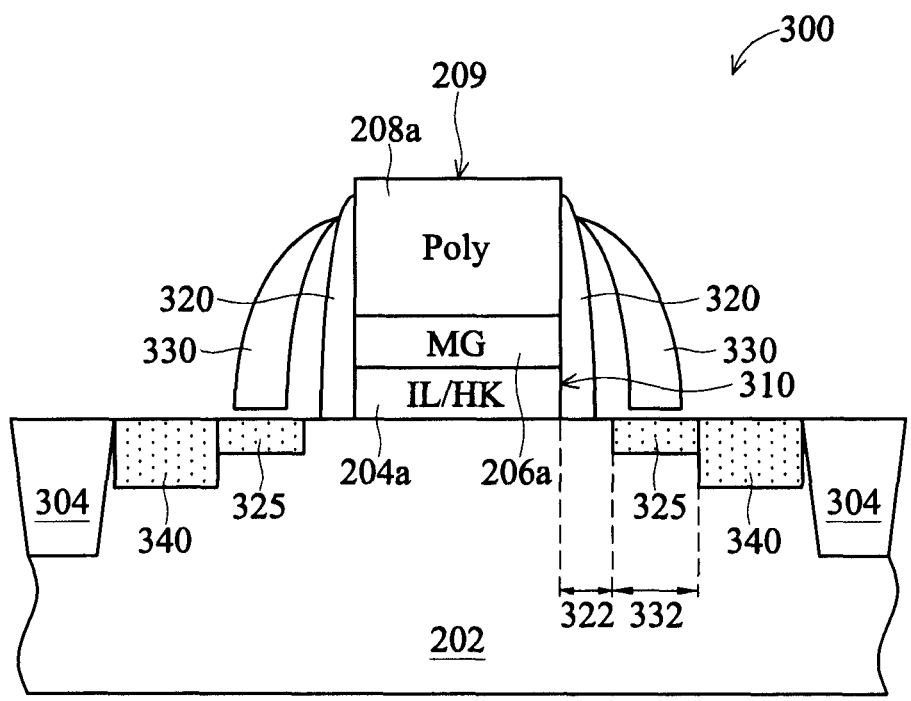
FIG. 3 is a cross-sectional view of a semiconductor device having a high-k metal gate with a single film sealing configuration.

Referring to FIG. 3, illustrated is a semiconductor device 300 having a sealing layer that may be configured as a single film. The semiconductor device 300 may be similar to the semiconductor device 200 of FIG. 2. Accordingly, similar features in FIGS. 2 and 3 are numbered the same for the sake of simplicity and clarity. Also, the semiconductor device 300 may or may not undergo the treatment process of FIG. 2 during fabrication. It is understood that the semiconductor device 300 may include various features and structures typically found in an integrated circuit but is simplified for a better understanding of the inventive concepts of the present disclosure.

The semiconductor device 300 may include a semiconductor substrate 202 such as a silicon substrate. The semiconductor device 300 may further include an isolation structure 304 such as a shallow trench isolation (STI) feature formed in the substrate 202 for isolating an active region in the substrate as is known in the art. The isolation structure 304 may be formed of silicon oxide, silicon nitride, silicon oxynitride, fluoride-doped silicate (FSG), and/or a low k dielectric material known in the art.

The semiconductor device 300 may include a gate dielectric layer 204a including an interfacial layer/high-k dielectric layer formed over the substrate 202. The semiconductor device 300 may further include a capping layer 310 for tuning a work function of a metal layer (for the gate electrode) for properly performing as an N-type metal-oxide-semiconductor (NMOS) transistor device and a P-type MOS (PMOS) transistor device, respectively. For example, the capping layer 310 may include lanthanum oxide, LaSiO, manganese oxide, aluminum oxide, or other suitable materials. The capping layer 310 may be formed on or underneath the high-k dielectric layer. The semiconductor device 300 may further include a metal gate layer 206a formed on the capping layer 310, and a poly layer 208a formed on the metal gate layer 206a.

Following a gate etching or patterning process, a sealing layer 320 may be formed on the sidewalls of the gate structure 209 including the metal gate layer 206a and gate dielectric layer 204a. The sealing layer 320 may be formed by a similar process (e.g., deposition and dry etching) discussed in FIG. 2 for forming sealing layer 230a. The sealing layer 320 may be configured as a single film having a thickness 322 ranging from 50 to about 150 angstrom (Å). The sealing layer 320 may include silicon nitride (SiN) or silicon oxynitride (SiON) or other suitable dielectric material.

The semiconductor device 300 may further include lightly doped source/drain (LDD) regions 325 formed in the substrate 202 by ion implantation. The doping species may depend on the type of device being fabricated such as an NMOS or PMOS device. The LDD regions 325 may be aligned with an outer edge of the sealing layer 320 following the ion implantation process. As previously noted, the sealing layer 325 may provide protection to prevent contamination or damage to the high-k gate dielectric 204a, capping layer 310, and metal gate layer 206a during subsequent processing. Thus, the integrity of the gate structure 209 may be maintained which may result in better device performance and reliability. Additionally, it should be noted that during a subsequent annealing process (e.g., activation) the dopants in the LDD regions 325 may diffuse towards the sidewalls of the gate structure 209 such that a portion of each of the LDD regions 325 may extend underneath a portion of the sealing layer 320.

Following formation of the LDD regions 325, conventional spacers 330 (referred also as S/D spacers) may be formed on the sealing layer 325 by a deposition and etching process as is known in the art. The spacers 330 may include silicon oxide or silicon nitride. In some embodiments, the spacers 330 may have a thickness 332 ranging from about 200 to about 400 angstrom. The spacers 330 may be used to offset source/drain (S/D) regions 340 (referred also as heavily doped source/drain regions). The S/D regions 340 may be formed in the substrate 202 by ion implantation as is known in the art. Accordingly, the S/D regions 340 may be aligned with an outer edge of the spacers 330 following the ion implantation process. Thereafter, the semiconductor device 300 may undergo further processing to form various features and structures such as contacts/vias, metal layers, interconnect layers, passivation layers, and so forth as is known in the art.

Figure 4:
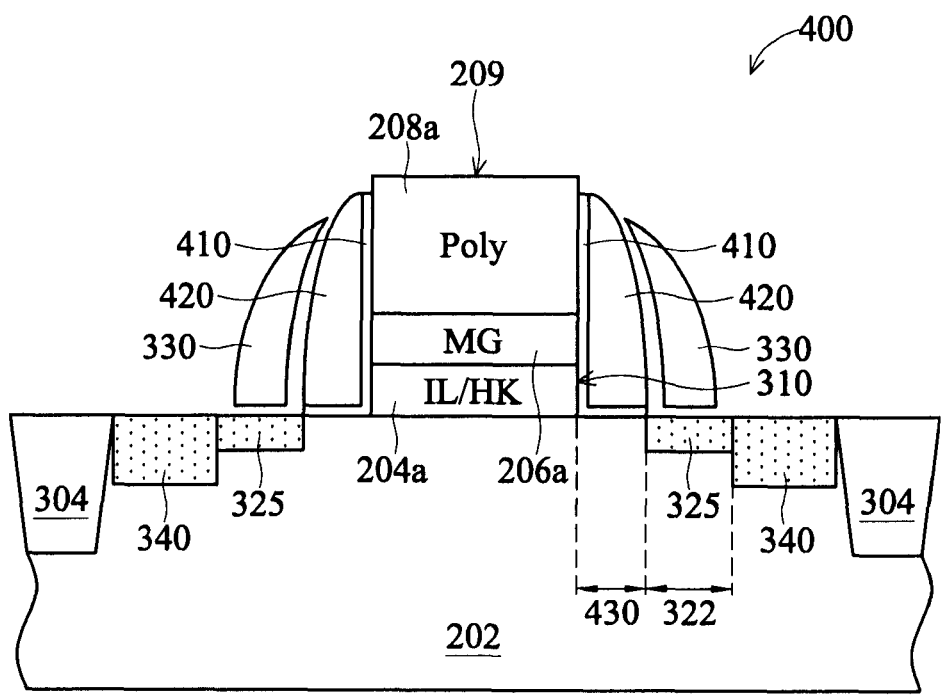
FIG. 4 is a cross-sectional view of a semiconductor device having a high-k metal gate with a dual film sealing configuration.

Referring to FIG. 4, illustrated is a semiconductor device 300 having a sealing layer that may be configured as a single film. The semiconductor device 300 may be similar to the semiconductor device 300 of FIG. 3 except for the differences described below. Accordingly, similar features in FIGS. 3 and 4 are numbered the same for the sake of simplicity and clarity. It is understood that the semiconductor device 400 may include various features and structures typically found in an integrated circuit but is simplified for a better understanding of the inventive concepts of the present disclosure. The semiconductor device 400 may include a sealing layer that is configured as a dual film instead of a single film of FIG. 3. The dual sealing layer may be formed by depositing a first sealing layer 410 over the gate structure 209, then depositing a second sealing layer 420 over the first sealing layer, and then performing an etch process such as a dry etching technique to form the dual sealing layer. The first sealing layer 410 may include a thickness ranging from about 20 to about 50 angstrom. The first sealing layer 410 may include silicon oxide or other suitable material. The second sealing layer 420 may include a thickness ranging from about 80 to about 200 angstrom. The second sealing layer 420 may include silicon nitride or other suitable material. The dual sealing layer may include a thickness 430 ranging from 100 to about 240 angstrom.

The semiconductor device 400 may further include lightly doped drain (LDD) regions 325 formed in the substrate 202 by ion implantation. The doping species may depend on the type of device being fabricated such as an NMOS or PMOS device. The LDD regions 325 may be aligned with an outer edge of the second sealing layer 420 of the dual sealing layer following the ion implantation process. As previously noted, the dual sealing layer may provide protection to prevent contamination or damage to the high-k gate dielectric 204a, capping layer 310, and metal gate layer 206a during subsequent processing. Thus, the integrity of the gate structure 209 may be maintained which may result in better device performance and reliability. Further, it should be noted that during a subsequent annealing process the LDD regions 325 may diffuse towards the sidewalls of the gate structure 209 such that a portion of each of the LDD regions 325 may extend underneath a portion of the dual sealing layer.

Following formation of the LDD regions 325, conventional spacers 330 (referred also as S/D spacers) may be formed on the sealing layer 325 by a deposition and etching process as is known in the art. The spacers 330 may include silicon oxide or silicon nitride. In some embodiments, the spacers 330 may have a thickness 332 ranging from about 200 to about 400 angstrom. The spacers 330 may be used to offset source/drain (S/D) regions 340 (referred also as heavily doped source/drain regions). The S/D regions 340 may be formed in the substrate 202 by ion implantation as is known in the art. Accordingly, the S/D regions 340 may be aligned with an outer edge of the spacers 330 following the ion implantation process. Thereafter, the semiconductor device 400 may undergo further processing to form various features and structures such as contacts/vias, metal layers, interconnect layers, passivation layers, and so forth as is known in the art.

Figure 5A:
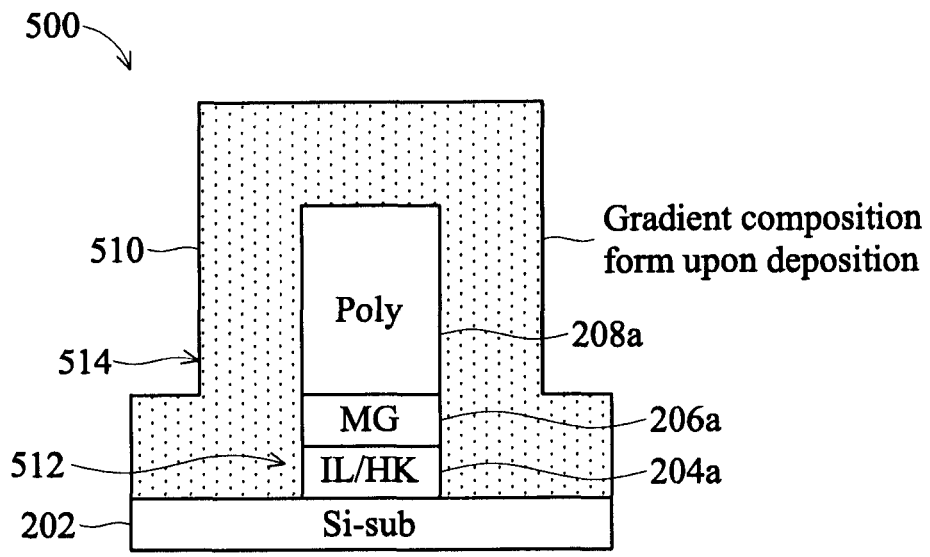
FIGS. 5A and 5B are cross-sectional views of a semiconductor device fabricated with a sealing feature having a gradient composition.
Figure 5B:
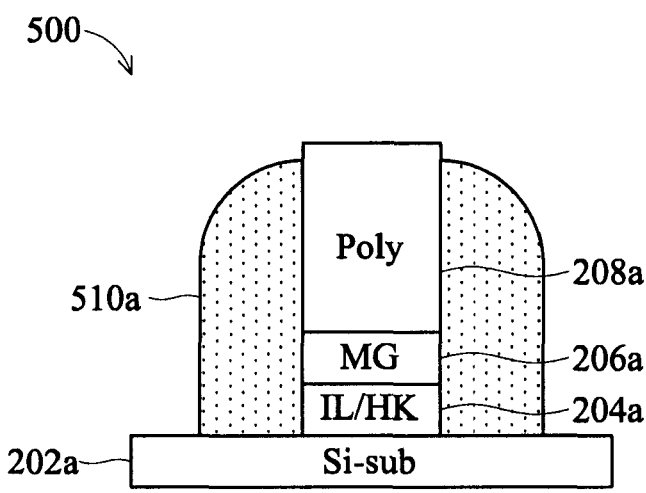

Referring to FIGS. 5A and 5B, illustrated are cross-sectional views of a semiconductor device 500 being fabricated with a sealing layer having a gradient composition. The semiconductor device 500 may be similar to the semiconductor devices 200, 300, 400 of FIGS. 2-4. Accordingly, similar features in FIGS. 2-5 are numbered the same for the sake of simplicity and clarity. It should be noted that the sealing layer having the gradient composition may be implemented in the formation of the S/D spacers (reference number 330 of FIG. 3) to provide for S/D spacers with a gradient composition. In FIG. 5a, following gate etching or patterning to form a gate structure including a IL/HK gate dielectric 204a, metal gate layer 206a, and poly layer 208, a sealing layer 510 may be formed over the gate structure and substrate 202 by CVD, plasma enhanced CVD (PECVD), ALD, or other suitable deposition process. During the deposition, process conditions (e.g., precursors) may be adjusted so as to form the sealing layer 510 with a gradient composition. In other words, a composition (or concentration) of the sealing layer 510 at an interface (or inner edge) 512 may be different than a composition (or concentration) of the sealing layer 510 at a top surface (or outer edge) 514. The different compositions may provide for different functionalities at the interface 512 and at the top surface 514. The materials that may be used and their compositions at the interface and at the top surface will be discussed later in reference to FIGS. 8-11. The composition of the sealing layer 510 at the interface 512 may be configured so as to provide a better interface (e.g., better adhesion) with the metal gate 206a and IL/HK gate dielectric 204a. The composition of the sealing layer 510 at the top surface 514 may be configured so as to provide a better barrier against contamination (e.g., block oxygen diffusion) during subsequent processing.

In FIG. 5B, a portion of the sealing layer 510 may be removed by an etch process such as a dry etching technique as was discussed disclosed above. Accordingly, a sealing layer 510a may be formed having the gradient composition in which the sealing layer 510a has better adhesion at the interface surface 512 and a better barrier at the top surface 514.

Figure 6A:
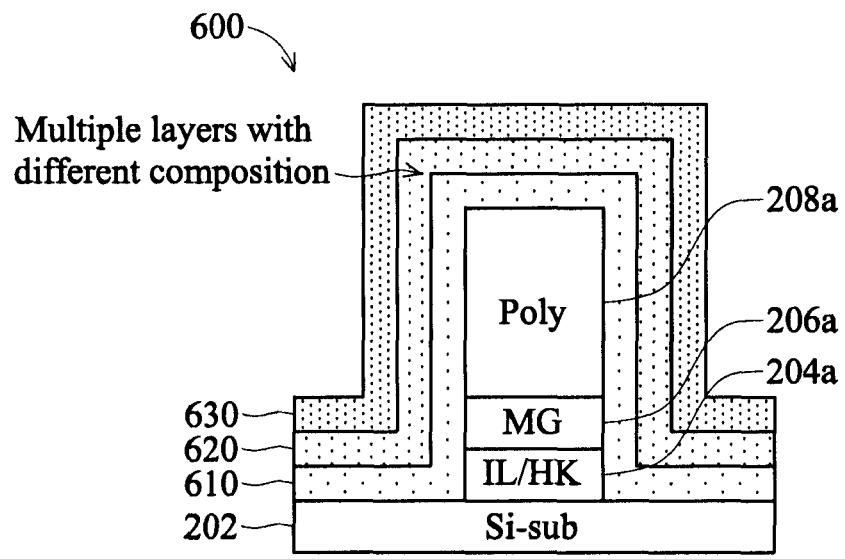
FIGS. 6A and 6B are cross-sectional views of a semiconductor device being fabricated with an alternative sealing feature having a gradient composition.
Figure 6B:
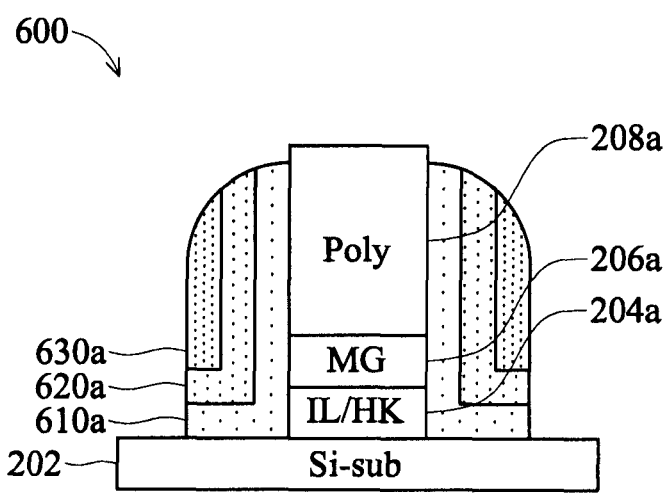

Referring to FIGS. 6A and 6B, illustrated are cross-sectional views of illustrated are cross-sectional views of a semiconductor device 600 being fabricated with an alternative sealing configuration having a gradient composition. The semiconductor device 600 may be similar to the semiconductor devices 200, 300, 400 of FIGS. 2-4. Accordingly, similar features in FIGS. 2-4 and 6 are numbered the same for the sake of simplicity and clarity. It should be noted that the sealing layer having the gradient composition may be implemented in the formation of the S/D spacers (reference number 330 of FIG. 3) to provide for S/D spacers with a gradient composition. In FIG. 6a, following gate etching or patterning to form a gate structure including a IL/HK gate dielectric 204a, metal gate layer 206a, and poly layer 208, a sealing layer having multiple films 610, 620, 630 with different compositions may be formed over the gate structure and substrate 202. The multiple films 610, 620, 630 collectively form a gradient composition. The multiple films 610, 620, 630 may be formed by CVD, plasma enhanced CVD (PECVD), ALD, or other suitable deposition process. The film 610 may include a composition that provides a better interface (e.g., better adhesion) with the metal gate 206a and IL/HK gate dielectric 204a. The film 630 may include a composition that provides a better barrier against contamination (e.g., block oxygen diffusion) during subsequent processing. The film 620 may include a composition somewhere in between the compositions of the film 610 and film 630. The materials that may be used and their compositions at the interface and at the top surface will be discussed later in reference to FIGS. 8-11.

In FIG. 6B, a portion of the multiple films 610, 620, 630 may be removed by an etch process such as a dry etching technique as was discussed disclosed above. Accordingly, a sealing layer may be formed having the gradient composition such that the film 610a has a better adhesion at the interface surface, the film 620a provides a good transition between the films 610 and 630, and the film 630a has a better barrier at the top surface. It is understood that although three films are implemented in this example, other configurations such as four, five, etc. films may be used as long as a gradient composition is provided.

Figure 7A:
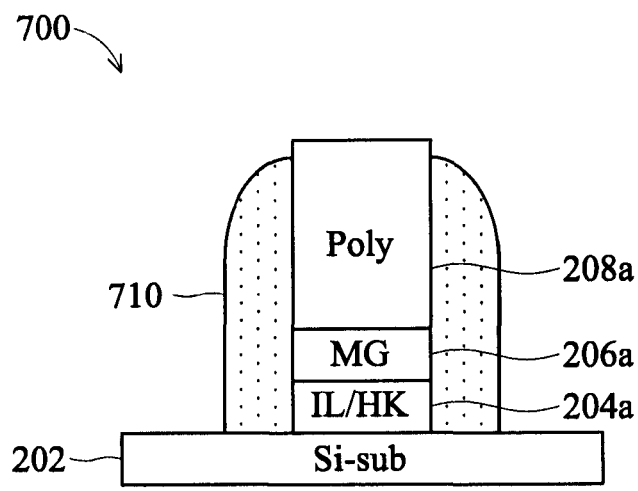
FIGS. 7A and 7B are cross-sectional views of a semiconductor device being fabricated with another alternative sealing feature having a gradient composition.
Figure 7B:
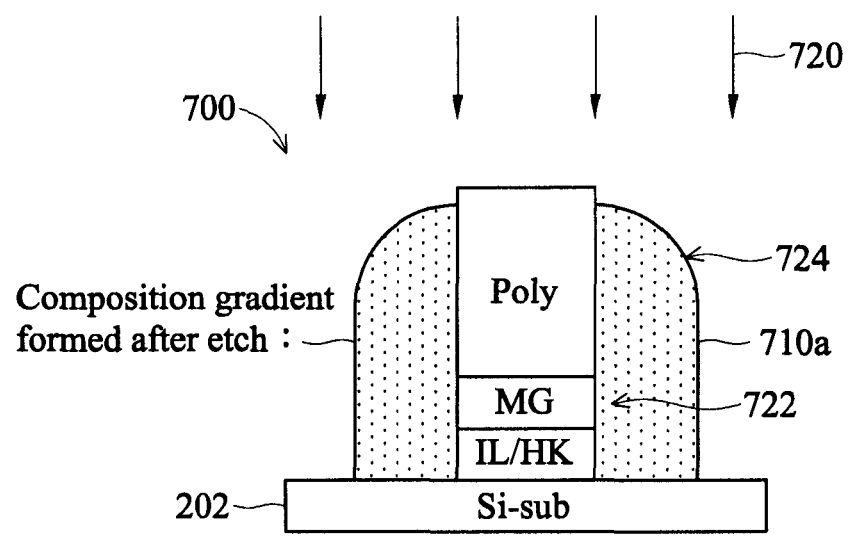

Referring to FIGS. 7A and 7B, illustrated are cross-sectional views of illustrated are cross-sectional views of a semiconductor device 700 being fabricated with another alternative sealing configuration having a gradient composition. The semiconductor device 700 may be similar to the semiconductor devices 200, 300, 400 of FIGS. 2-4. Accordingly, similar features in FIGS. 2-4 and 7 are numbered the same for the sake of simplicity and clarity. It should be noted that the sealing layer having the gradient composition may be implemented in the formation of the S/D spacers (reference number 330 of FIG. 3) to provide for S/D spacers with a gradient composition. In FIG. 7a, following gate etching or patterning to form a gate structure including a IL/HK gate dielectric 204a, metal gate layer 206a, and poly layer 208, a sealing layer 710 having a uniform composition may be formed over the gate structure and substrate 202. The sealing layer 710 may be formed by CVD, plasma enhanced CVD (PECVD), ALD, or other suitable deposition process. A portion of the sealing layer 710 may be removed by an etch process such as a dry etching technique as was discussed disclosed above.

In FIG. 7B, a treatment process 720 may be performed on the sealing layer 710 to transform the uniform sealing layer to a sealing layer 710a having a gradient composition. Accordingly, a composition (or concentration) of the sealing layer 710a at an interface surface (or inner edge) 7222 may be different than a composition (concentration) of the sealing layer 710a at a top surface (or outer edge) 724. The different compositions may provide for different functionalities at the interface 722 and at the top surface 724. The composition of the sealing layer 710a at the interface 722 may be configured so as to provide a better interface (e.g., better adhesion) with the metal gate 206a and IL/HK gate dielectric 204a. The composition of the sealing layer 710a at the top surface 724 may be configured so as to provide a better barrier against contamination (e.g., block oxygen diffusion) during subsequent processing.

In some embodiments, the treatment process 720 may include a thermal nitridation using gases such as $NH_3$ or $N_2$ to incorporate nitrogen onto the top surface 724. In other embodiments, the treatment process 720 may include a plasma nitride process to incorporate nitrogen onto the top surface 724. In some other embodiments, the treatment process 720 may include an ion implantation process to incorporate nitrogen onto the top surface 724. In yet other embodiments, the treatment process 720 may include an oxygen ($O_2$) annealing prior to or after the nitridation of the top surface so as to improve the interface 712.

As discussed above in reference to FIGS. 5-7, a sealing layer may have a gradient composition to provide for different functionalities at the interface and at the top surface of the sealing layer. Accordingly, the integrity of the gate stack including the metal gate and high-k gate dielectric may be maintained throughout processing, and thus device performance and reliability is improved. Various materials and concentrations may be implemented to achieve these goals as discussed below in FIGS. 8-11. It should be noted these are mere examples and other configurations of sealing layers with gradient composition may be implemented as well.

Figure 8:
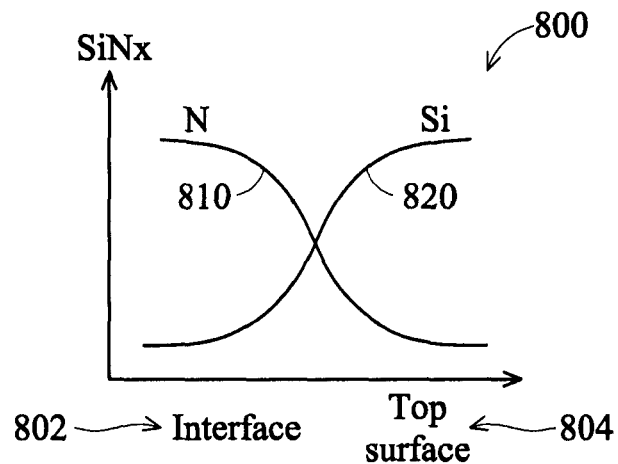
FIG. 8 is a graph illustrating a gradient composition of a silicon nitride (SiN) sealing layer that may be implemented in the sealing features of FIGS. 5-7.

Referring to FIG. 8, illustrated is a graph 800 showing a gradient composition of a silicon nitride (SiN) sealing layer from an interface 802 to a top surface 804. A line 810 illustrates that the nitrogen (N) concentration at the interface 802 is higher than the nitrogen concentration at the top surface 804 of the sealing layer, and also the gradient distribution of nitrogen between the interface and top surface. More nitrogen at the interface 802 may provide a better interface quality for the metal gate and high-k gate dielectric. A line 820 illustrates that the silicon (Si) concentration at the interface 802 is lower than the silicon concentration at the top surface 804 of the sealing layer, and also the gradient distribution of silicon between the interface and top surface. Accordingly, the Si-rich silicon nitride (SiN) at the top surface 804 may provide a better barrier to block oxygen diffusion and prevent contamination during subsequent processing.

Figure 9:
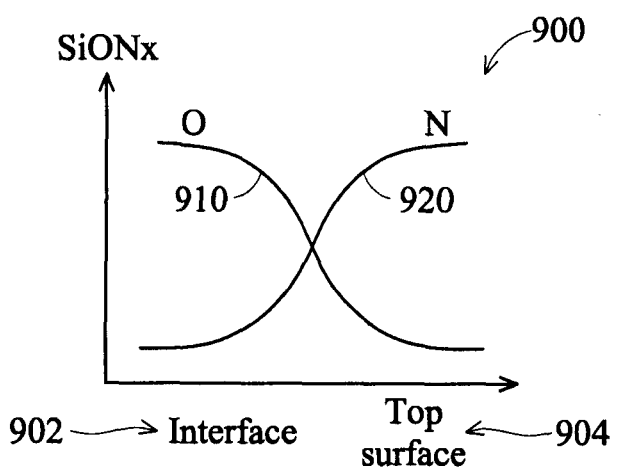
FIG. 9 is a graph illustrating a gradient composition of a silicon oxynitride (SiON) sealing layer that may be implemented in the sealing features of FIGS. 5-7.

Referring to FIG. 9, illustrated is a graph 900 showing a gradient composition of a silicon oxynitride (SiON) sealing layer from an interface 902 to a top surface 904. A line 910 illustrates that the oxygen (O) concentration at the interface 902 is higher than the oxygen concentration at the top surface 904 of the sealing layer, and also the gradient distribution of oxygen between the interface and top surface. More oxygen at the interface 902 may reduce high-k interface traps and thus a better quality interface may be provided. A line 920 illustrates that the nitrogen (N) concentration at the interface 902 is lower than the nitrogen concentration at the top surface 904 of the sealing layer, and also the gradient distribution of nitrogen between the interface and top surface. Accordingly, the N-rich silicon oxynitride (SiON) at the top surface 904 may provide a better barrier to block oxygen diffusion and prevent contamination during subsequent processing.

Figure 10:
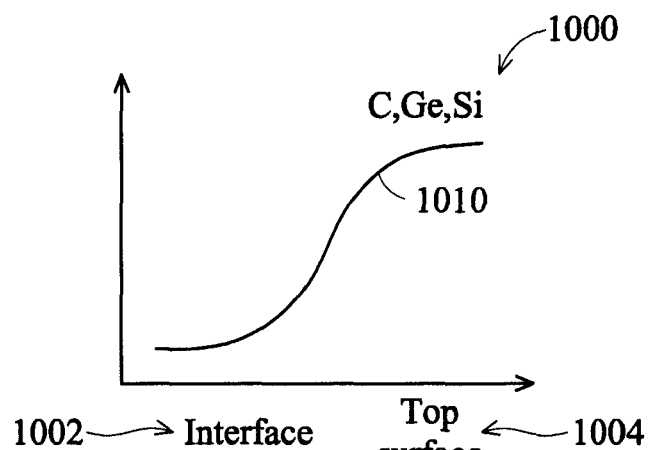
FIG. 10 is a graph illustrating a gradient composition of a sealing layer having C, Ge, or Si that may be implemented in the sealing features of FIGS. 5-7.

Referring to FIG. 10, illustrated is a graph 1000 showing a gradient composition of a sealing layer containing other species such as carbon (C), germanium (Ge), and silicon (Si) from an interface 1002 to a top surface 1004. A line 1010 illustrates that the C, Ge, or Si concentration at the interface 1002 may be lower than the C, Ge, or Si concentration at the top surface 1004 of the sealing layer, and also the gradient distribution of C, Ge, or Si between the interface and top surface. Accordingly, the sealing layer containing C, Ge, or Si with a gradient composition may achieve different functionalities at the interface 1002 and at the top surface 1004 as was discussed above.

Figure 11:
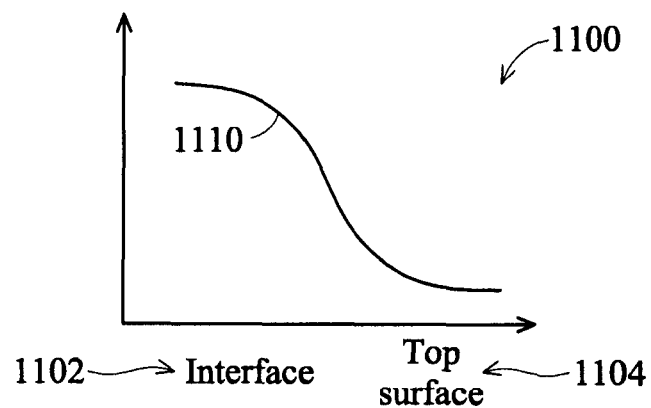
FIG. 11 is a graph illustrating a gradient composition of a sealing layer having a metal species that may be implemented in the sealing features of FIGS. 5-7.

Referring to FIG. 11, illustrated is a graph 1100 showing a gradient composition of a oxygen gettering sealing layer containing a metal species such as Ta, Ti, Hf, Zr, W, Mo, or combinations thereof from an interface 1102 to a top surface 1104. A line 1110 illustrates that the metal species concentration at the interface 1102 may be higher than the metal species concentration at the top surface 1104 of the sealing layer, and also the gradient distribution of the metal species between the interface and top surface. Accordingly, the sealing layer containing C, Ge, or Si with a gradient composition may achieve different functionalities at the interface 1102 and at the top surface 1104 as was discussed above.

The present invention achieves different advantages in various embodiments disclosed herein. It is understood that different embodiments disclosed herein offer different advantages, and that no particular advantage is necessarily required for all embodiments. For example, the present disclosed method provides a simple and cost-effective sealing structure that maintains the integrity of metal gate and high-k gate dielectric, and thus improves device performance and reliability. The methods and devices disclosed herein may be easily integrated with current CMP process flow and thus are applicable in future and advanced technologies. In some embodiments, a single film configuration may be used as the sealing layer and in other embodiments a multiple film configuration may be used as the sealing layer. In some other embodiments, the seal layer may include a gradient composition so as to provide different functionalities at the interface and at the top surface. In still other embodiments, the gradient composition profile may be controlled to have a lighter concentration at the sidewall and bottom for a better interface quality, and a higher concentration at the top surface for a better barrier against contamination. The various sealing configurations disclosed herein provide protection so that the metal gate and high-k gate dielectric are not damaged and/or contaminated by subsequent processing (e.g., acid etch, oxidized, nitridized, etc.).

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the methods and devices disclosed herein may be implemented in a gate first process, a gate last process, or hybrid process. In the gate first process, a true metal gate structure may be formed first and may be followed by normal process flow to fabricate the final device. In the gate last process, a dummy poly gate structure may be formed first and may continue with normal process flow until deposition of an interlayer dielectric (ILD), and thereafter the dummy poly gate structure may be removed and replaced with a true metal gate structure. In the hybrid gate process, the metal gate for one device (NMOS or PMOS device) may be formed first and the metal gate for another device (PMOS or NMOS) may be formed last. Further, the various sealing configurations and treatment processes disclosed herein may be combined in various combinations as well.

What is claimed is:

1. A method of fabricating a semiconductor device comprising:
   providing a semiconductor substrate having a high-k dielectric layer and a metal layer formed thereon;
   patterning the high-k dielectric layer and the metal layer to form a gate structure having sidewalls;
   performing a first treatment process on the gate structure;
   forming a sealing layer on the gate structure and on the substrate;
   performing a second treatment process on the sealing layer;
   removing a first portion of the sealing layer such that a second portion of the sealing layer remains on the sidewalls of the gate structure; and
   after removing the first portion of the sealing layer, performing an ion implantation process to form a lightly doped drain (LDD) region that is aligned with an outer edge of the second portion of the sealing layer.

2. The method of claim 1, wherein the first treatment process and second treatment process include one of:
   a plasma treatment process using a gas containing nitrogen or oxygen;
   an implantation process using a gas containing nitrogen or oxygen;
   a low temperature oxide process using a temperature that is less than 200° C.; and
   an annealing process using a gas containing nitrogen or oxygen.

3. The method of claim 2, further comprising, after removing the first portion of the sealing layer, performing a third treatment process on the second portion of the sealing layer, the third treatment process being the same type as the first treatment process or the second treatment process.

4. The method of claim 1, wherein the first treatment process includes performing the first treatment process with nitrogen and oxygen.

5. The method of claim 1, wherein the sealing layer includes a metal material.

6. The method of claim 1, further comprising forming another sealing layer over the sealing layer, the another sealing layer being different than the sealing layer.

7. The method of claim 1, wherein the first treatment process includes at least one of a thermal treatment, a plasma treatment, and an ion implantation treatment, and
   wherein the second treatment process includes at least one of the thermal treatment, the plasma treatment, and the ion implantation treatment.

8. A method comprising:
   providing a semiconductor substrate having a gate structure formed thereon; and
   forming a sealing layer on sidewalls of the gate structure, the sealing layer formed of a first material component and a second material component such that a ratio of the first and second material components changes from an inner edge of the sealing layer to an outer edge of the sealing layer, the first and second material components being different from each other and the first and second material components both being present at both the inner edge and the outer edge of the sealing layer.

9. The method of claim 8, wherein forming the sealing layer on the sidewalls of the gate structure includes:
   forming a first sealing layer having a first ratio of the first and second material components on the sidewalls of the gate structure; and
   forming a second sealing layer having a second ratio of the first and second material components over the first sealing layer.

10. The method of claim 8, wherein forming the sealing layer on the sidewalls of the gate structure includes performing a treatment process to incorporate the first and second material components into the sealing layer.

11. The method of claim 10, wherein the treatment process includes at least one of a thermal treatment, a plasma treatment, and an ion implantation treatment.

12. The method of claim 8, wherein the first material component is selected from the group consisting of Si, N, O, C, Ge, Si, Ti, Ta, Hf, Zr, W, and Mo.

13. The method of claim 8, further comprising removing a portion of the sealing layer to expose a top portion of the gate structure.

14. The method of claim 8 further comprising forming a spacer on the outer edge of the sealing layer, the spacer being different than the sealing layer.

15. The method of claim 8, wherein the first material component includes oxygen and the second material component includes nitrogen.

16. A method comprising:
    providing a semiconductor substrate having a gate stack that includes a sealing layer; and
    performing a treatment process on the sealing layer to incorporate a first component and a second component into the sealing layer such that a ratio of the first and second components varies across the sealing layer, the first and second components being different from each other and the first and second components both being present throughout the sealing layer.

17. The method of claim 16, wherein performing the treatment process includes performing at least one of a thermal treatment, a plasma treatment, and an ion implantation treatment.

18. The method of claim 16, wherein the first component includes a dielectric material and the second component includes a metal material.

19. The method of claim 16, wherein the first component includes silicon and the second component includes nitrogen.

20. The method of claim 16, further comprising:
    forming a spacer on the sealing layer; and
    forming source/drain regions at either side of the gate stack, each source/drain region including a lightly doped region that is aligned with the outer edge of the sealing layer and a heavy doped region that is aligned with an outer edge of the spacer, the outer edge of the sealing layer being closer to the gate stack than the outer edge of the spacer.

* * * * *